(12) United States Patent
Tanaka (10) Patent No.: US 7,170,750 B2
(45) Date of Patent: Jan. 30, 2007

(54) ELECTRONIC APPARATUS

(75) Inventor: Makoto Tanaka, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 277 days.

(21) Appl. No.: 10/994,938

(22) Filed: Nov. 22, 2004

(65) Prior Publication Data

US 2005/0117307 A1    Jun. 2, 2005

(30) Foreign Application Priority Data

Nov. 28, 2003   (JP)   ............................. 2003-399818

(51) Int. Cl.
*H05K 7/20* (2006.01)
(52) U.S. Cl. ...................... 361/719; 361/704; 257/718; 257/719; 165/185
(58) Field of Classification Search ...................... None
See application file for complete search history.

(56) References Cited

U.S. PATENT DOCUMENTS

| | | | |
|---|---|---|---|
| 5,089,936 A * | 2/1992 | Kojima et al. .............. | 361/705 |
| 5,268,817 A | 12/1993 | Miyagawa et al. | |
| 5,648,889 A * | 7/1997 | Bosli .......................... | 361/704 |
| 5,731,952 A | 3/1998 | Ohgami et al. | |
| 6,005,767 A | 12/1999 | Ku et al. | |
| 6,049,459 A * | 4/2000 | Edmonds et al. ........... | 361/707 |
| 6,141,214 A | 10/2000 | Ahn | |
| 6,166,907 A | 12/2000 | Chien | |
| 6,196,850 B1 | 3/2001 | Dietz et al. | |
| 6,231,371 B1 | 5/2001 | Helot | |
| 6,282,082 B1 | 8/2001 | Armitage et al. | |
| 6,296,048 B1 | 10/2001 | Sauer | |
| 6,313,990 B1 | 11/2001 | Cheon | |
| 6,333,847 B1 | 12/2001 | Katsui et al. | |
| 6,377,452 B1 | 4/2002 | Sasaki et al. | |
| 6,396,687 B1 | 5/2002 | Sun et al. | |
| 6,418,017 B1 | 7/2002 | Patel et al. | |
| 6,430,038 B1 | 8/2002 | Helot et al. | |
| 6,437,973 B1 | 8/2002 | Helot et al. | |
| 6,464,195 B1 | 10/2002 | Hildebrandt | |
| 6,477,871 B1 | 11/2002 | Shaw et al. | |
| 6,483,445 B1 | 11/2002 | England | |
| 6,519,143 B1 | 2/2003 | Goko | |
| 6,519,147 B2 | 2/2003 | Nakagawa et al. | |
| 6,519,148 B2 | 2/2003 | Nakagawa et al. | |
| 6,594,149 B2 | 7/2003 | Yamada et al. | |
| 6,625,022 B2 * | 9/2003 | Frutschy et al. ............ | 361/700 |

(Continued)

FOREIGN PATENT DOCUMENTS

EP    0834795    4/1998

(Continued)

*Primary Examiner*—Boris Chérvinsky
(74) *Attorney, Agent, or Firm*—Blakely Sokoloff Taylor & Zafman LLP (57) ABSTRACT

An electronic apparatus includes a housing, a substrate, a bridge, a radiating plate, and a retaining member. The substrate is built in the housing. The bridge has an element portion and is mounted on the substrate. The radiating plate is thermally connected to the element portion. The retaining member has a pressing portion and three feet. The pressing portion is located on an opposite of the element portion about the radiating plate and abuts on the radiating plate. Three feet extend in three directions from the pressing portion and their respective end portions are fixed on the substrate. The retaining member urges the pressing portion toward the radiating plate.

10 Claims, 6 Drawing Sheets

U.S. PATENT DOCUMENTS

| | | |
|---|---|---|
| 6,625,024 B2 | 9/2003 | Mermet-Guyennet |
| 6,654,234 B2 | 11/2003 | Landry et al. |
| 6,717,798 B2 | 4/2004 | Bell et al. |
| 6,728,102 B2 | 4/2004 | Ishikawa et al. |
| 6,755,626 B2 | 6/2004 | Komatsu et al. |
| 6,774,870 B2 | 8/2004 | Mead, Jr. et al. |
| 6,809,927 B2 | 10/2004 | Ohashi et al. |
| 6,809,930 B2 * | 10/2004 | Mueller et al. ............. 361/704 |
| 6,856,506 B2 | 2/2005 | Doherty et al. |
| 6,873,521 B2 | 3/2005 | Landry et al. |
| 7,054,158 B2 * | 5/2006 | Kimmich .................... 361/704 |
| 7,095,614 B2 * | 8/2006 | Goldmann ................. 361/704 |
| 2002/0018337 A1 | 2/2002 | Nakamura |
| 2002/0053421 A1 | 5/2002 | Katsumi et al. |
| 2002/0141159 A1 | 10/2002 | Bloemen |
| 2003/0039097 A1 | 2/2003 | Igarashi |
| 2003/0142474 A1 | 7/2003 | Karidis et al. |
| 2004/0057197 A1 | 3/2004 | Hill et al. |
| 2005/0007739 A1 | 1/2005 | Gata |
| 2005/0052833 A1 | 3/2005 | Tanaka et al. |
| 2005/0068732 A1 | 3/2005 | Tsuji |
| 2005/0164624 A1 | 7/2005 | Hisamatsu |

FOREIGN PATENT DOCUMENTS

| | | |
|---|---|---|
| JP | 07-049725 | 2/1995 |
| JP | 07-142886 | 6/1995 |
| JP | 08/046097 | 2/1996 |
| JP | 10-004161 | 1/1998 |
| JP | 10-055227 | 2/1998 |
| JP | 10-261884 | 9/1998 |
| JP | 10/303582 | 11/1998 |
| JP | 11-039058 | 2/1999 |
| JP | 11-166500 | 6/1999 |
| JP | 2000-049478 | 2/2000 |
| JP | 2001-057490 | 2/2001 |
| JP | 2001-230356 | 8/2001 |
| JP | 2001-251079 | 9/2001 |
| JP | 2002-099356 | 4/2002 |
| JP | 2002-344186 | 11/2002 |
| JP | 2002-353670 | 12/2002 |
| JP | 2003-044169 | 2/2003 |
| JP | 2003-068317 | 3/2003 |
| JP | 2003-101272 | 4/2003 |
| JP | 2003-172286 | 6/2003 |
| JP | 2003-216278 | 7/2003 |
| JP | 3431024 | 7/2003 |
| JP | 2003-233441 | 8/2003 |
| JP | 3452059 | 9/2003 |
| JP | 2003-343492 | 12/2003 |
| JP | 2004-047921 | 2/2004 |

* cited by examiner

ELECTRONIC APPARATUS

CROSS-REFERENCE TO RELATED APPLICATIONS

This application is based upon and claims the benefit of priority from prior Japanese Patent Application No. 2003-399818, filed Nov. 28, 2003, the entire contents of which are incorporated herein by reference.

BACKGROUND OF THE INVENTION

1. Field of the Invention

This invention relates to an electronic apparatus having a heat conducting member mounted on an element which is mounted on a substrate built in a housing and which generates heat.

2. Description of the Related Art

A portable computer (PC) is an electronic apparatus in which an MPU (Micro Processing Unit) executing various arithmetic operations is mounted on a substrate built in a housing. In accordance with higher density of circuits and acceleration of the operations, the amount of heat generation in the MPU tends to increase. For this reason, a cooler is provided to positively cool the MPU as seen in, for example, Jpn. Pat. Appln. KOKAI Publication No. 2003-101272.

The cooler comprises a heat receiving portion and a spring member. The heat receiving portion is in close contact with an electronic component which is a heat generating portion. The spring member has four feet that overlap four corners of the squared heat receiving portion, respectively. By fixing an end portion of each foot on the substrate, the spring member presses the heat receiving portion onto the electronic component.

As the operation speed of the MPU is accelerated, the amount of heat generation in electronic components related with the MPU tends to increase and they are needing to be cooled. Thus, further providing heat transfer components for removal of heat on the electronic components mounted in the vicinity of the MPU is reviewed. In addition, as the PC becomes multifunctional and downsized, the number of wiring provided on a PWB (Printed Wiring Board) on which the MPU and the peripheral electronic components are mounted is increased. In accordance with improvement of the mounting density of the components, the mounting space on the PWB is decreased.

Therefore, if the heat transfer components are attached to the electronic components in the vicinity of the MPU as well as the cooler of the MPU, it is difficult to form screw holes to fix the heat transfer components on the substrate, at appropriate positions. If the screw holes are formed with priority, the wiring must be formed while making a detour to avoid the screw holes. For this reason, the wiring of good efficiency may be prevented. In other words, providing attachment portions of heat transfer components on the PWB is one of the important elements in the designing of the PWB.

BRIEF SUMMARY OF THE INVENTION

The object of the present invention is to provide an electronic apparatus whose component mounting efficiency can be improved.

An electronic apparatus according to an aspect of the present invention includes a housing, a substrate, a circuit module, a heat conducting member, and a retaining member. The substrate is built in the housing. The circuit module has an element portion and is mounted on the substrate. The heat conducting member is thermally connected to the element portion. The retaining member has a pressing portion and three feet. The pressing portion is located on an opposite portion to the element portion about the heat conducting member and abuts on the heat conducting member. Three feet extend in three directions from the pressing portion and their respective end portions are fixed on the substrate. The retaining member urges the heat conducting member toward the element portion.

According to the present invention, the component mounting efficiency can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
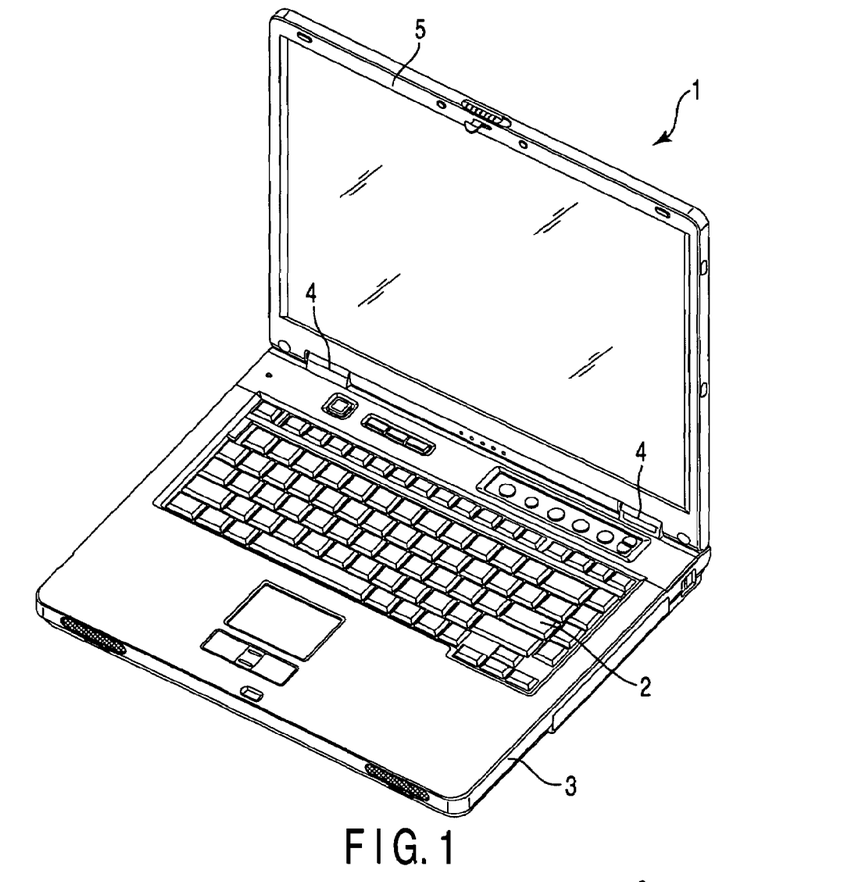
FIG. 1 is a perspective view showing an electronic apparatus of a first embodiment according to the present invention.
Figure 2:
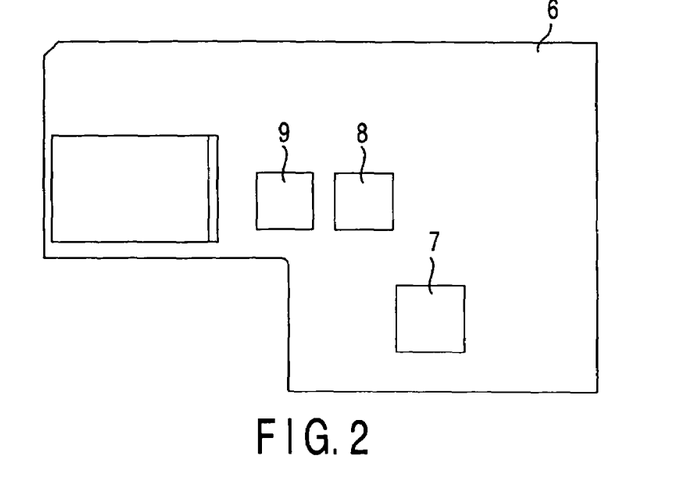
FIG. 2 is an illustration showing a substrate built in the electronic apparatus of FIG. 1.

A notebook PC 1 served as an electronic apparatus of a first embodiment according to the present invention will be explained below with reference to FIG. 1 to FIG. 4. The notebook PC 1 shown in FIG. 1 comprises a housing 3 having a keyboard 2 serving as an input operating portion provided on a top surface thereof, and a display panel 5 coupled to the housing 3 by hinges 4. A substrate 6 shown in FIG. 2 is built in the housing 3. An MPU 7, a bridge 8 and a VGA (Video Graphics Array) 9 are mounted on the substrate 6. The bridge 8 and the VGA 9 are an example of a circuit module which provided in the vicinity of the MPU 7. Load on each of the bridge 8 and the VGA 9 is varied in accordance with variation in load applied to the MPU 7. As the load increases, the amount of heat radiation is also increased. FIG. 2 shows an example of arrangement of the MPU 7, the bridge 8 and the VGA 9 on the substrate 6, and their arrangement is not limited to this.

Figure 3:
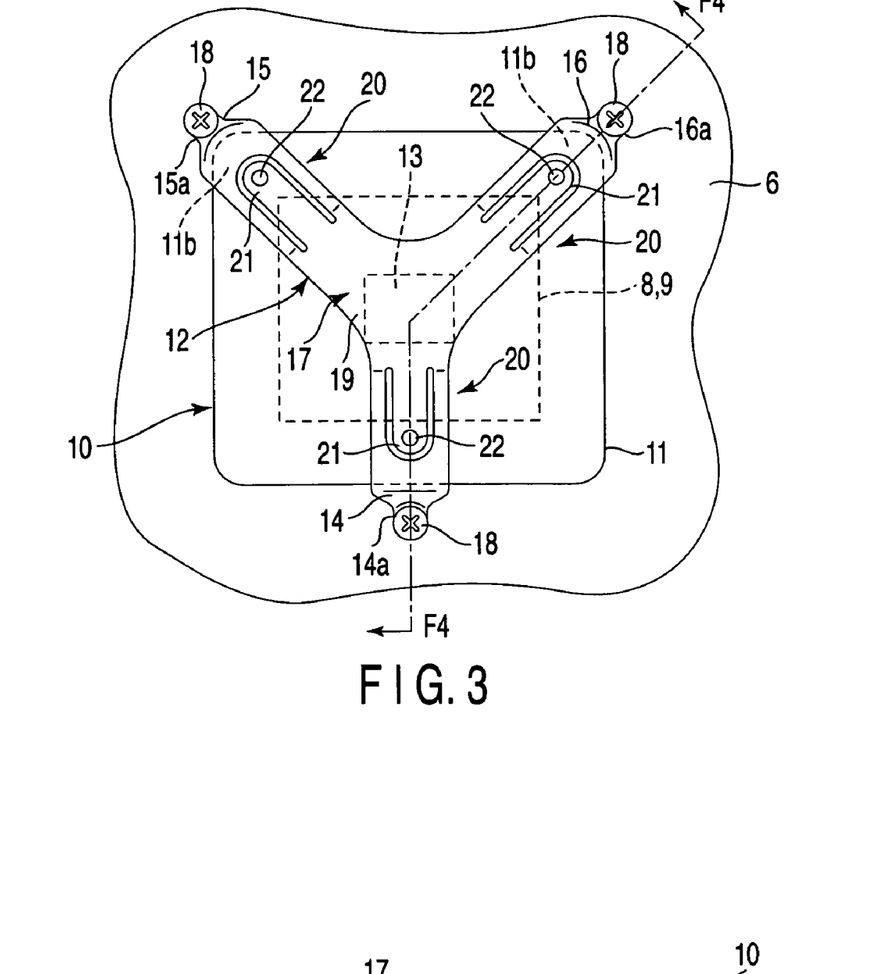
FIG. 3 is a plan view showing a state in which a radiating unit is attached to a circuit module mounted on the substrate of FIG. 2.
Figure 4:
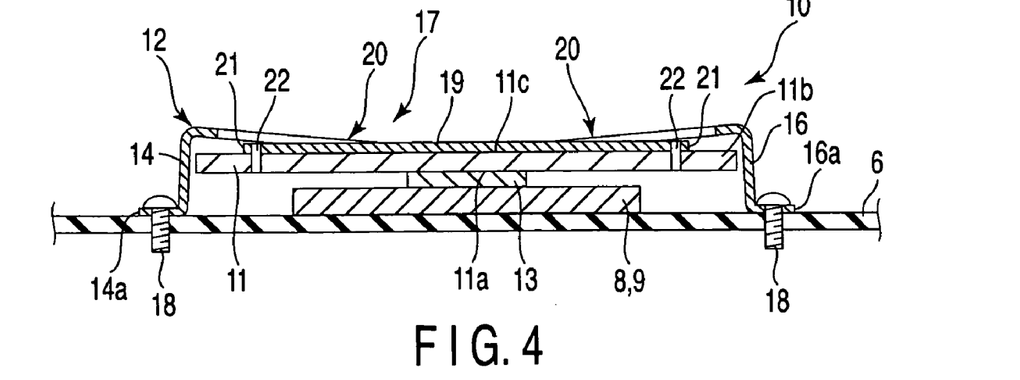
FIG. 4 is a cross-sectional view showing the substrate, the circuit module and the radiating unit as seen along a line F4—F4 of FIG. 3.

To remove the generated heat, a radiating unit 10 is attached to the bridge 8 and the VGA 9 as shown in FIG. 3. The radiating unit 10 comprises a radiating plate 11 which serves as a heat conducting member, and a retaining member 12 which fixes the radiating plate 11 to the substrate 6. The radiating plate 11 is shaped in a square which has round angles and which is larger than the bridge 8 and the VGA 9. An element portion 13 is provided at a central portion of the bridge 8 and the VGA 9. A heat transfer portion 11*a* of the radiating plate 11 is in close contact with an element portion 13 as shown in FIG. 4. It is preferable that a small gap formed between the radiating plate 11 and the element portion 13 is filled with a paste-like heat transfer material to improve the close contact between the radiating plate 11 and the element portion 13. A detailed shape of the radiating plate 11 is obtained by considering the amount of the heat input from the heat transfer portion 11*a*, the amount of the heat dissipation from an outer surface of the radiating plate 11, and a thermal conductivity of the radiating plate 11. As the material of the radiating plate 11, aluminum, aluminum alloy, copper, silver, gold or the like with high thermal conductivity, is used.

The retaining member 12 has three feet 14, 15 and 16, and a pressing portion 17 as shown in FIG. 3. The feet 14, 15 and 16 extend toward the substrate 6, so as to go around outer peripheral edges of the radiating plate 11. End portions 14*a*, 15*a* and 16*a* of the respective feet 14, 15 and 16 are fixed on the substrate 6 by screws 18 as shown in FIG. 4. The end portions 14*a*, 15*a* and 16*a* of the respective feet 14, 15 and 16 may be fixed on the substrate 6 by soldering, swaging, or insertion.

The end portions 14*a*, 15*a* and 16*a* are arranged at positions corresponding to vertexes of a triangle including the element portion 13. In the first embodiment, one of the feet (first foot 14) is provided so as to go around one of sides extending straight, of the radiating plate 11. Remaining two feet (second foot 15 and third foot 16) are provided so as to go around corner portions 11*b* of the radiating plate 11, which are to be both ends of a side opposite to the side at which the first foot 14 is arranged.

The pressing portion 17 has a contact portion 19 and urging portions 20. The contact portion 19 abuts on a pressed portion 11*c* which is provided to be opposite to the heat transfer portion 11*a* of the radiating plate 11. The urging portion 20 is provided between the contact portion 19 and each of feet 14, 15 and 16. In other words, the pressing portion 17 is provided in a shape in which the urging portions 20 extend radially from the contact portion 19. The urging portions 20 are bent in a direction away from the radiating plate 11, in the middle of the contact portion 19 and the feet 14, 15 and 16 as shown in FIG. 4. The feet 14, 15 and 16 are provided continuously with the urging portions 20. Therefore, the retaining member 12 becomes capable of urging the radiating plate 11 toward the element portion 13 by fixing the feet 14, 15 and 16 on the substrate 6.

Inside portions of the urging portions 20 are cut out while remaining the contact portion 19 side, and extend along the radiating plate 11, successively from the contact portion 19. Cutout ends 21 near the feet 14, 15 and 16 are connected to the radiating plate 11 by eyelets 22. The cutout ends 21 and the radiating plate 11 may be connected not by the eyelets 22, but by spot welding, laser welding, swaging or the like. Even if the cutout ends 21 are not connected they have the function of the present invention.

In the notebook PC 1 having the above-described structure, the radiating unit 10 is attached to the bridge 8 and the VGA 9 serving as the circuit modules. Therefore, as the load of the MPU 7 is increased, heat generated in the element portions 13 of the bridge 8 and the VGA 9 is transmitted from the heat transfer portion 11*a* to the radiating plate 11. The heat transmitted to the radiating plate 11 is radiated from the outer peripheral surface thereof. The radiating unit 10 is fixed to the substrate 6 by three feet 14, 15 and 16. In other words, the occupied area required to attach the radiating unit 10 to the substrate 6 is smaller as compared with a cooler fixed at four positions. The flexibility of designing of the wiring on the substrate 6 is thereby increased.

Next, a second embodiment according to the present invention will be described with reference to FIG. 5. Elements having like or similar functions to those of the first embodiment are denoted by same reference numerals and a description thereof will be omitted.

Figure 5:
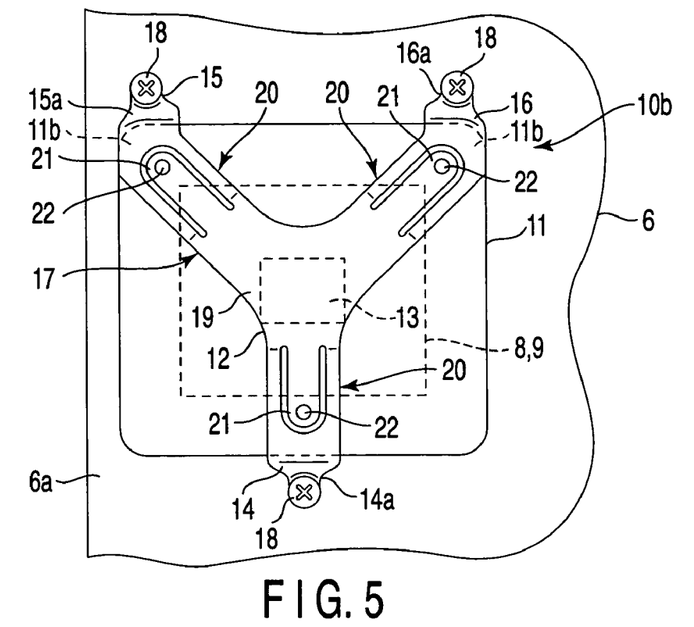
FIG. 5 is a plan view showing the circuit module and the radiating unit which are mounted on a substrate of an electronic apparatus of a second embodiment according to the present invention.

A radiating unit 10*b* shown in FIG. 5 is different from the radiating unit of the first embodiment with respect to the arrangement of the feet 14, 15 and 16. The first foot 14 is provided so as to go around one of the sides of the radiating plate 11 as shown in FIG. 5. The end portion 14*a* of the first foot 14 is provided in a direction away from the element portion 13. The second foot 15 and the third foot 16 are provided so as to go around the corner portions 11*b* of the radiating plate 11. The end portion 15*a* of the second foot 15 and the end portion 16*a* of the third foot 16 are formed toward an opposite direction to the end portion 14*a* of the first foot 14.

In the radiating unit 10*b* described above, as shown in FIG. 5, the end portions 14*a*, 15*a* ands 16*a* project from two parallel sides of the radiating plate 11 shaped in a square. Nothing projects from sides which extend in a direction crossing the sides from which the end portions 14*a*, 15*a* and 16*a* project. Therefore, even if the bridge 8 and the VGA 9 serving as the circuit modules are arranged near an edge 6*a* of the substrate 6, the radiating unit 10*b* can be attached to the bridge 8 and the VGA 9 by arranging the end portions 14*a*, 15*a* and 16*a* along the edge 6*a* of the substrate 6.

Next, a third embodiment according to the present invention will be described with reference to FIG. 6. Elements having like or similar functions to those of the first embodiment are denoted by same reference numerals and a description thereof will be omitted.

Figure 6:
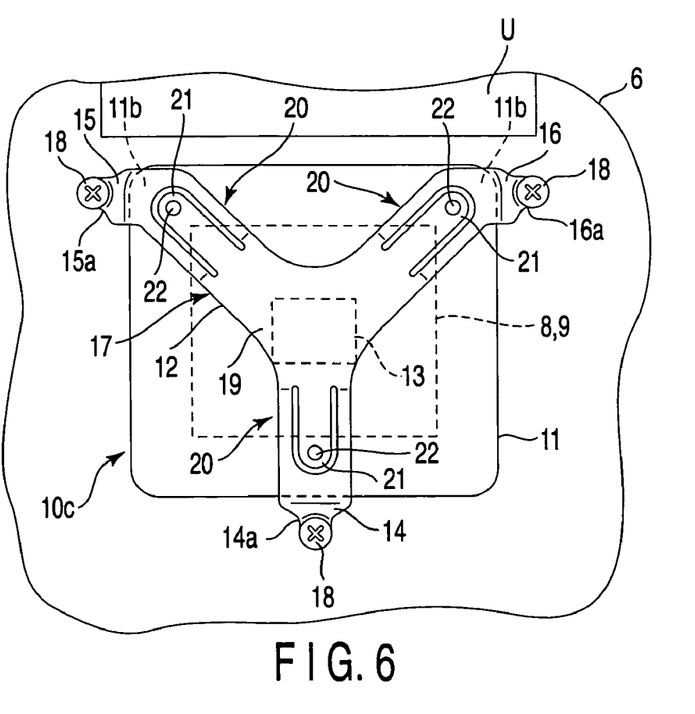
FIG. 6 is a plan view showing the circuit module and the radiating unit which are mounted on a substrate of an electronic apparatus of a third embodiment according to the present invention.

A radiating unit 10c shown in FIG. 6 is different from the radiating unit of the first and second embodiments with respect to the arrangement of the feet 14, 15 and 16. The first foot 14 is provided so as to go around one of the sides of the radiating plate 11 as shown in FIG. 6. The end portion 14a of the first foot 14 is provided in a direction of leaving from the element portion 13. The second foot 15 and the third foot 16 are provided so as to go around the corner portions 11b of the radiating plate 11. The end portion 15a of the second foot 15 and the end portion 16a of the third foot 16 are formed in a direction of separating from each other, along a direction which crosses the extending direction of the end portion 14a of the first foot 14.

In the radiating unit 10c described above, as shown in FIG. 6, nothing projects from the opposite edge to the side at which the first foot 14 is arranged, of the radiating plate 11 shaped in a square. Therefore, even if the other module or a unit U is arranged side by side with the bridge 8 and the VGA 9, on the substrate 6, the radiating unit 10c can be attached to the bridge 8 and the VGA 9 by making the side from which the foot 14, 15 or 16 does not projects face the other module or the unit U.

In addition, the radiating unit 10b of the second embodiment can be attached to the bridge 8 and the VGA 9 arranged in the vicinity of the other module or the unit U, similarly to the radiating unit 10c of the third embodiment. Moreover, the radiating unit 10c of the third embodiment can also be attached to the bridge 8 and the VGA 9 arranged in the vicinity of the edge of the substrate 6, similarly to the radiating unit 10b of the second embodiment.

Next, a fourth embodiment according to the present invention will be described with reference to FIG. 7. Elements having like or similar functions to those of the first to third embodiments are denoted by same reference numerals and a description thereof will be omitted.

Figure 7:
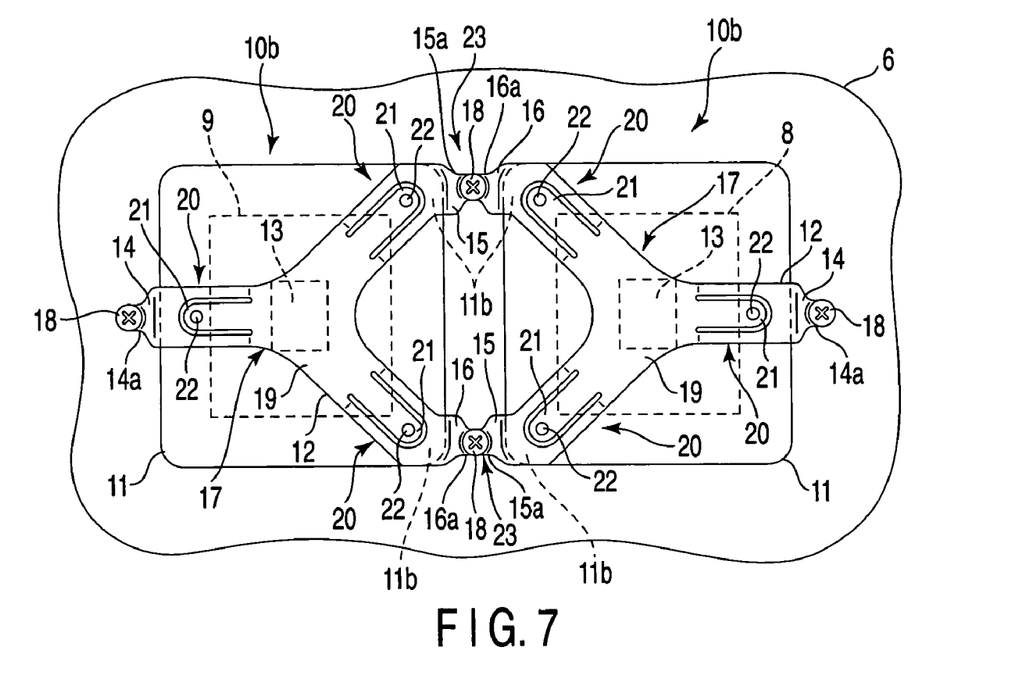
FIG. 7 is a plan view showing the circuit module and the radiating unit which are mounted on a substrate of an electronic apparatus of a fourth embodiment according to the present invention.
Figure 10:
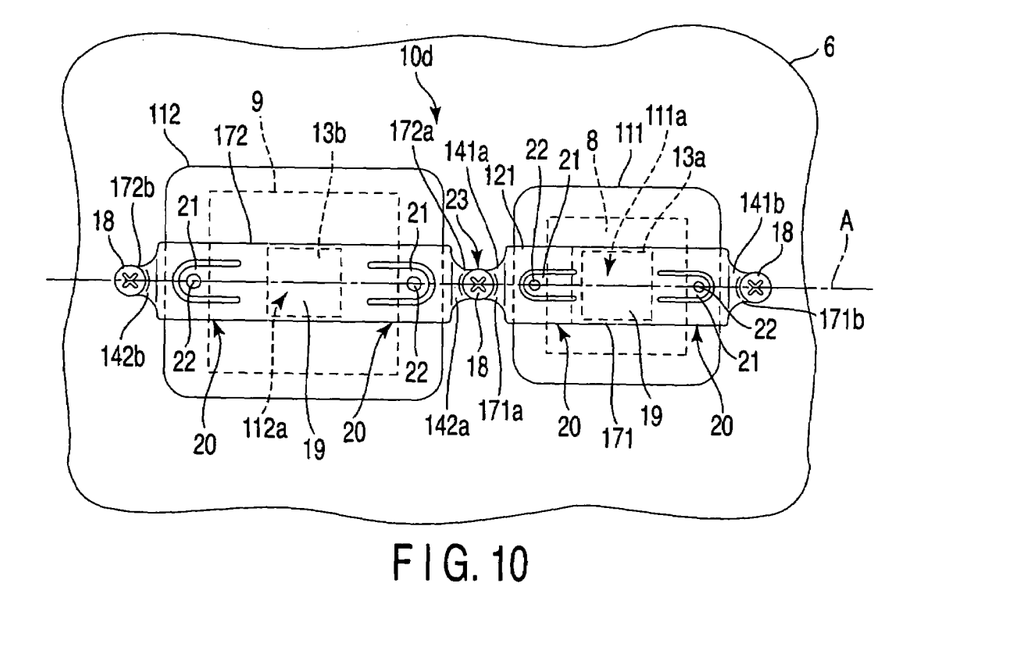
FIG. 10 is a plan view showing the circuit module and the radiating unit which are mounted on a substrate of an electronic apparatus of a seventh embodiment according to the present invention.

The bridge 8 and the VGA 9 are arranged closely to each other, on the substrate 6, as shown in FIG. 7. In this case, the radiating unit 10b shown in FIG. 10 is adopted as a radiating unit attached to the bridge 8 and a radiating unit attached to the VGA 9. The end portion 15a of the second foot 15 of one of the radiating unit and the end portion 16a of the third foot 16 of another radiating unit are overlapped and fixed to the substrate 6, and the end portion 16a of the third foot 16 of one of the radiating unit and the end portion 15a of the second foot 15 of another radiating unit, are overlapped and fixed to the substrate 6.

Thus, the second foot 15 and the third foot 16 of the radiating units 10b attached to the adjacent circuit modules are fixed to the same position on the substrate 6. The occupied area to be attached each radiating unit 10b to the substrate 6 can be therefore made smaller. The attachment of the radiating units 10b can be simplified if a radiating unit having the end portion 15a of the second foot 15 of one of the radiating units 10b and the end portion 16a of the third foot 16 of the other radiating unit 10b coupled continuously is provided instead of respectively providing the radiating units 10b on the bridge 8 and the VGA 9, and sharing the positions of the fixed feet thereof.

Next, a fifth embodiment according to the present invention will be described with reference to FIG. 8. Elements having like or similar functions to those of the first to fourth embodiments are denoted by same reference numerals and a description thereof will be omitted.

In the fifth embodiment, the radiating unit 10c shown in FIG. 6 is adopted as radiating unit attached to the adjacent circuit modules. The radiating units 10c are fixed on the substrate 6 such that the end portions 14a of the first feet 14 of the radiating units 10c are overlapped.

Thus, the occupied area for attaching each radiating unit 10c on the substrate 6 can be made smaller by fixing at least one of the feet of the radiating unit 10c, i.e. the first foot 14 in this case, at a common position. Similarly to the fourth embodiment, the assembling operation of the radiating unit can be simplified if a radiating unit continuously formed at the end portions such as the end portions 14a of the first feet 14 of the radiating units 10c is provided instead of respectively attaching the radiating unit 10c to the bridge 8 and the VGA 9, and sharing the positions of the fixed feet thereof.

Figure 8:
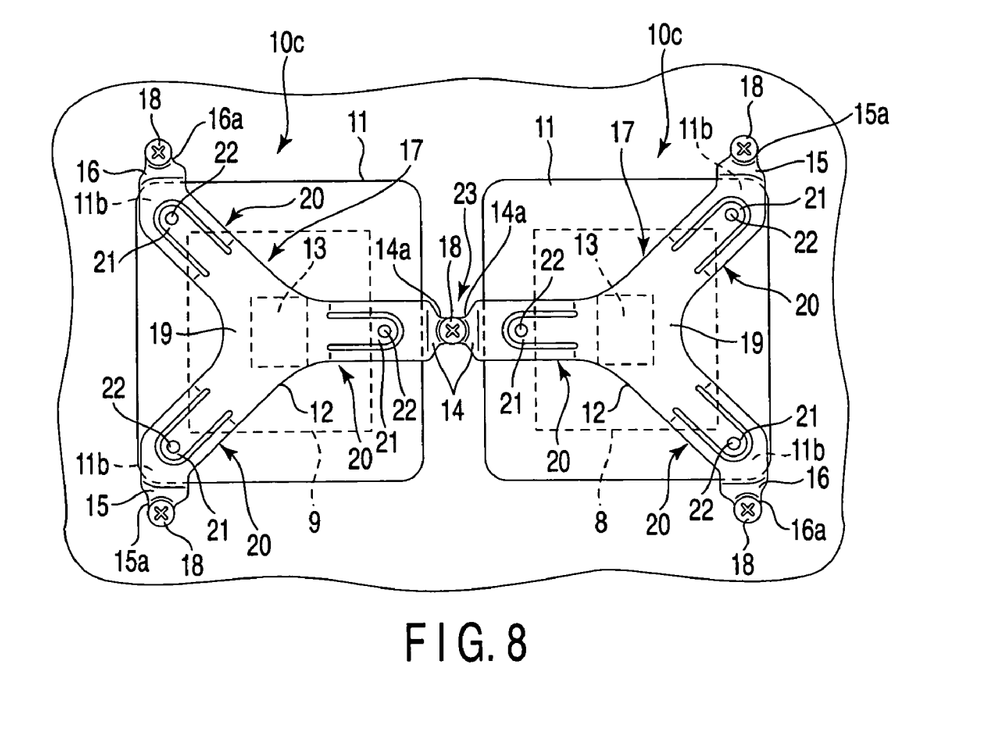
FIG. 8 is a plan view showing the circuit module and the radiating unit which are mounted on a substrate of an electronic apparatus of a fifth embodiment according to the present invention.

As shown in FIG. 8, the bridge 8 and the VGA 9 can be arranged side by side, in the vicinity of other adjacent units or modules, by attaching the radiating units 10c to the bridge 8 and the VGA 9. In addition, the wiring between the bridge 8 and the VGA 9, extending to other electronic components mounted on the substrate 6, can easily be arranged.

Next, a sixth embodiment of the present invention will be described with reference to FIG. 9. Elements having like or similar functions to those of the first to fifth embodiments are denoted by same reference numerals and a description thereof will be omitted.

Figure 9:
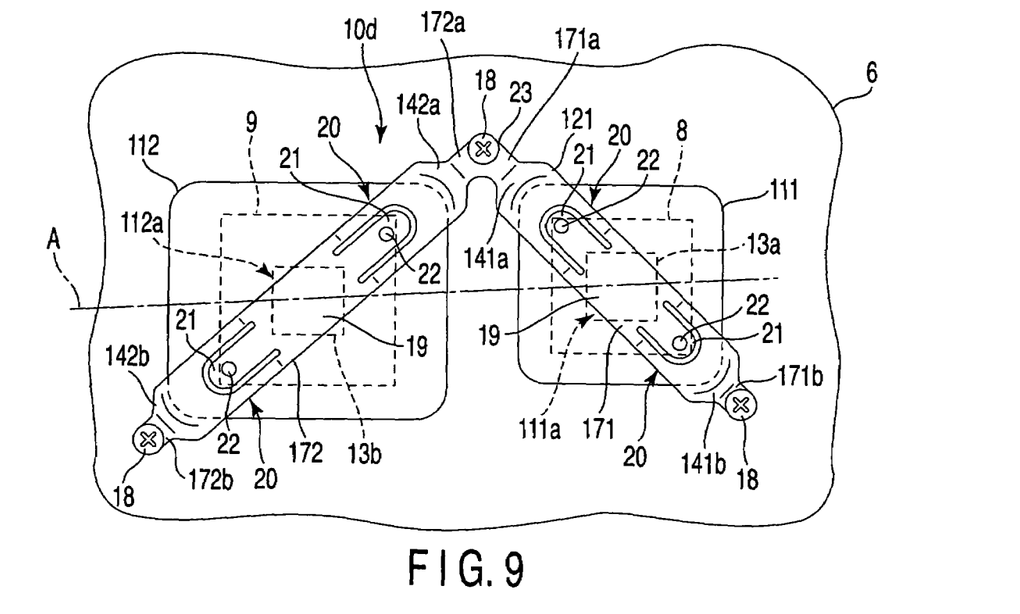
FIG. 9 is a plan view showing the circuit module and the radiating unit which are mounted on a substrate of an electronic apparatus of a sixth embodiment according to the present invention.

The bridge 8 serving as the first circuit module and the VGA 9 serving as the second circuit module are mounted side by side on the substrate 6 as shown in FIG. 9. A radiating unit 10d is attached to the bridge 8 and the VGA 9, respectively. The radiating unit 10d has a first radiating plate 111 serving as a first heat conducting member, a second radiating plate 112 serving as a second heat conducting member, and a retaining member 121.

The first radiating plate 111 has a heat transfer portion 111a which is in close contact with a first element portion 13a exposed from the bridge 8. The second radiating plate 112 has a heat transfer portion 112a which is in close contact with a second element portion 13b exposed from the VGA 9. The first radiating plate 111 and the second radiating plate 112 are formed to be one size larger than the bridge 8 and the VGA 9, respectively.

The retaining member 121 has a first pressing portion 171 and a second pressing portion 172. A fixing portion 23 is provided at a position adjacent to both the bridge 8 and the VGA 9. The first pressing portion 171 is arranged in a direction of crossing the first element portion 13a of the bridge 8 from the fixing portion 23. The second pressing portion 172 is arranged in a direction of crossing the second element portion 13b of the VGA 9 from the fixing portion 23.

An end portion 171a of a foot 141a of the first pressing portion 171 and an end portion 172a of a foot 142a of the second pressing portion 172 are provided continuously and fixed to the fixing portion 23 by the screw 18. An end portion 171b of a foot 141b of the first pressing portion 171 is fixed to the substrate 6 by the screw 18, at a position passed over the first radiating plate 111. An end portion 172b of a foot 142b of the second pressing portion 172 is fixed to the substrate 6 by the screw 18, at a position passed over the second radiating plate 112.

In the sixth embodiment, the fixing portion 23 is provided at a position remote from a line A extending in a direction in which the first element portion 13a and the second element portion 13b are aligned. Therefore, the end portion 171b of the first pressing portion 171 and the end portion 172b of the second pressing portion 172 are fixed to the substrate 6, on an opposite to the fixing portion 23 about the line A.

Each of the first pressing portion 171 and the second pressing portion 172 has the contact portion 19 and the urging portion 20. The contact portion 19 of the first pressing portion 171 abuts on an area of the opposite to the heat transfer portion 111a of the first radiating plate 111. The contact portion 19 of the second pressing portion 172 abuts on an area of the opposite to the heat transfer portion 112a of the second radiating plate 112. The urging portion 20 of the first pressing portion 171 is provided at a position of both sides of the first element portion 13a, specifically a position between the contact portion 19 and the feet 141a, 141b. The urging portion 20 of the second pressing portion 172 is provided at a position of both sides of the second element portion 13b, specifically a position between the contact portion 19 and the feet 142a, 142b.

In the radiating unit 10d having the above described structure, the first radiating plate 111 which is in close contact with the first element portion 13a of the bridge 8, and the second radiating plate 112 which is in close contact with the second element portion 13b of the VGA 9, are fixed on the substrate 6 by both the end portions 171a, 171b of the first pressing portion 171 and both the end portions 172a, 172b of the second pressing portion 172, respectively. In addition, the end portion 171a of the first pressing portion 171 and the end portion 172a of the second pressing portion 172 are provided continuously and fixed on the fixing portion 23. In other words, the radiating unit attached to two circuit modules is fixed at three positions.

The occupied area required to attach the radiating unit 10d to the substrate 6 is smaller as compared with a case where radiating units are attached to respective circuit modules. In other words, the flexibility of the wiring on the substrate 6 is thereby increased.

Next, a seventh embodiment according to the present invention will be described with reference to FIG. 10. Elements having like or similar functions to those of the first to sixth embodiments are denoted by same reference numerals and a description thereof will be omitted. The seventh embodiment is different from the sixth embodiment, with respect to the feature that the first pressing portion 171 and the second pressing portion 172 are arranged linearly along the line A, in opposite directions to each other about the fixing portion 23, as shown in FIG. 10.

In the sixth and seventh embodiments, the first pressing portion 171 and the second pressing portion 172 are formed continuously, but may be formed separately. Overlapping the end portions 171a and 172a on the fixing portion 23 is substantially of no functional difference from unitedly forming the end portions 171a and 172a. In addition, the feet 141a, 141b and the feet 142a, 142b are provided so as to go around the opposite corner portions of the respective radiating plates 111 and 112 in the sixth embodiment, while the feet are provided so as to go around the opposite sides of the respective radiating plates 111 and 112 in the seventh embodiment. However, the feet may be provided so as to go around the opposite corner portions of the radiating plate 111 and so as to go around the opposite sides of the radiating plate 112, and vice versa.

Figure 11:
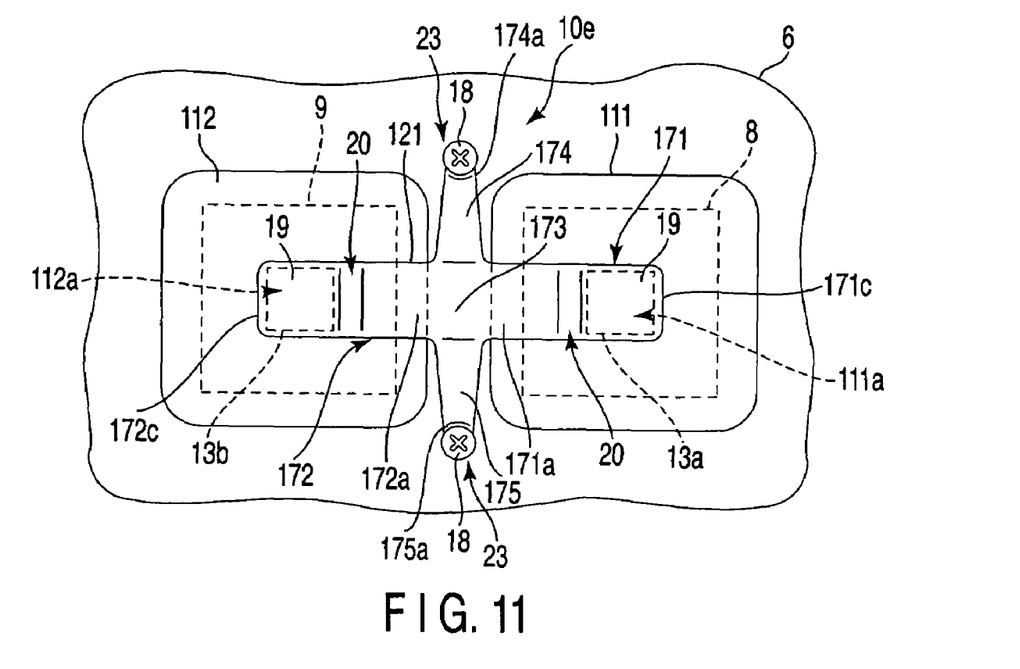
FIG. 11 is a plan view showing the circuit module and the radiating unit which are mounted on a substrate of an electronic apparatus of an eighth embodiment according to the present invention.

Next, an eighth embodiment of the present invention will be described with reference to FIG. 11. Elements having like or similar functions to those of the first to seventh embodiments are denoted by similar reference numbers and are not described in detail here.

A radiating unit 10e is attached to the bridge 8 and the VGA 9. The radiating unit 10e has the first pressing portion 171 and the second pressing portion 172. As shown in FIG. 11, the end portion 171a of the first pressing portion 171 and the end portion 172a of the second pressing portion 172, which are considered as the proximal portions of the respective pressing portions, are supported between the bridge 8 and the VGA 9. The end portion 171a and the end portion 172a are formed sequentially on a common plane. End portions 174 and 175 are formed to extend from a connecting portion 173 provided between the end portions 171a and 172a, along a space between the bridge 8 and the VGA 9. End portions 174a and 175a of the respective feet 174 and 175 are fixed on the substrate 6 by the screws 18.

The urging portions 20 are formed in the middle parts of the first pressing portion 171 and the second pressing portion 172, respectively. The contact portions 19 are provided at distal portion 171c of the first pressing portion 171 and the distal portion 172c of the second pressing portion 172, respectively. The distal portion 171c is pushed on a portion of the opposite to the heat transfer portion 111a of the radiating plate 111. The distal portion 172c is pushed on a portion of the opposite to the heat transfer portion 112a of the radiating plate 112. The distal portions 171c and 172c may be attached and fixed to the respective radiating plates 111 and 112 by spot welding or laser welding, or the other method such as swaging, rivets, eyelets or the like, or may be pushed and retained by an urging force.

In the radiating unit 10e having the above-described structure, the heat generated at the bridge 8 and the VGA 9 is transferred to the radiating plates 111 and 112 through the heat transfer portions 111a and 112a. The radiating unit 10e is merely fixed at two positions for two circuit modules. The occupied area required to attach the radiating unit 10e to the substrate 6 is therefore smaller as compared with a case where radiating units are attached to respective circuit modules. In addition, since the connecting portion 173 is arranged between two circuit modules, i.e. the bridge 8 and the VGA 9, each of the radiating plates 111 and 112 can be urged with a substantially even urging force.

Next, a ninth embodiment according to the present invention will be described with reference to FIG. 12. Elements having like or similar functions to those of the first to eighth embodiments are denoted by same reference numerals and a description thereof will be omitted.

Figure 12:
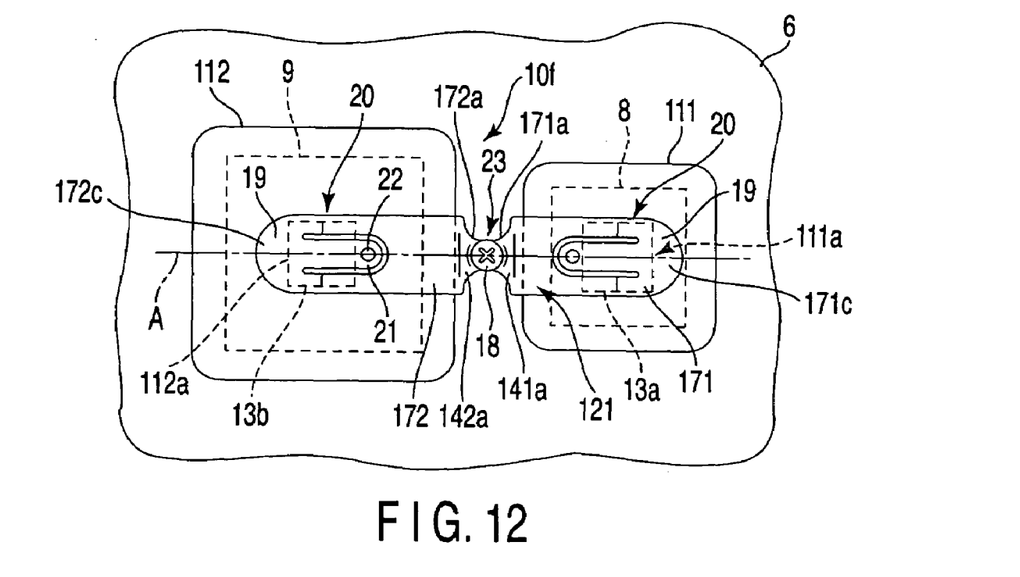
FIG. 12 is a plan view showing the circuit module and the radiating unit which are mounted on a substrate of an electronic apparatus of a ninth embodiment according to the present invention.

A radiating unit 10f is attached to the bridge 8 and the VGA 9 as shown in FIG. 12. The radiating unit 10f has the first pressing portion 171 and the second pressing portion 172. The end portions 171a and 172a are fixed at the fixing portion 23, which is provided on the substrate 6, between the bridge 8 and the VGA 9. The first pressing portion 171 and the second pressing portion 172 may be provided separately or formed unitedly at the end portions 171a and 172a.

The radiating unit 10f has a structure which is omitted the end portions 171b and 172b from the radiating unit 10d of the seventh embodiment. In other words, the radiating unit 10f is fixed at only one position on the substrate 6. The occupied area required to attach the radiating unit 10f to the substrate 6 is therefore smaller as compared with a case where radiating units are attached to two circuit modules, respectively.

In each of the embodiment, the bridge 8 and the VGA 9 have been explained as the circuit modules. However, the present invention may be applied to the other circuit module such as the MPU 7. In addition, in a case where three or more circuit modules are aligned side by side, the occupied area required to attach the radiating unit to the substrate 6 can be therefore smaller by attaching the radiating units as described in the fourth to ninth embodiments to the respective circuit modules.

Moreover, the heat conducting member may be formed integrally with a heat sink or thermally connected to a heat sink formed as another member. Furthermore, the heat conducting member may be thermally connected to a fan module having a radiating member.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic apparatus comprising:
a housing;
a substrate built in the housing;
a circuit module which has an element portion and is mounted on the substrate;
a heat conducting member which is thermally connected to the element portion; and
a retaining member having a pressing portion which is located at an opposite to the element portion about the heat conducting member to abut on the heat conducting member, and three feet which extend from the pressing portion in three directions and have respective end portions fixed on the substrate, said retaining member urging the heat conducting member toward the element portion.

2. The electronic apparatus according to claim 1, wherein:
the heat conducting member has a pair of side portions at positions which sandwiches the pressing portion;
a first foot of the three feet extends in a direction of crossing one of the pair of side portions; and
a second foot and a third foot of the three feet extend in a direction of crossing the other one of the pair of side portions.

3. The electronic apparatus according to claim 1, wherein:
a first foot of the three feet extends in a direction away from the element portion; and
a second foot and a third foot of the three feet extend in a direction separating from each other, along a direction crossing the extending direction of the first foot.

4. An electronic apparatus comprising:
a housing;
a substrate built in the housing;
a first circuit module which has a first element portion and is mounted on the substrate;
a second circuit module which has a second element portion and is mounted side by side with the first circuit module on the substrate;
a first heat conducting member which is thermally connected to the first element portion;
a second heat conducting member which is thermally connected to the second element portion;
a first retaining member which has a pressing portion located at an opposite to the first element portion about the first heat conducting member to abut on the first heat conducting member, and three feet extending from the pressing portion in three directions and having respective end portions fixed on the substrate, said first retaining member urging the first heat conducting member toward the first element portion; and
a second retaining member which has a pressing portion located at an opposite to the second element portion about the second heat conducting member to abut on the second heat conducting member, and three feet extending from the pressing portion in three directions and having respective end portions fixed on the substrate, said second retaining member urging the second heat conducting member toward the second element portion,
wherein at least one of the three feet in the first retaining member and at least one of the three feet in the second retaining member are fixed together on the substrate, between the first circuit module and the second circuit module.

5. An electronic apparatus comprising:
a housing;
a substrate built in the housing;
a first circuit module which has a first element portion and is mounted on the substrate;
a second circuit module which has a second element portion and is mounted side by side with the first circuit module on the substrate;
a first heat conducting member which is thermally connected to the first element portion;
a second heat conducting member which is thermally connected to the second element portion;
a fixing portion located between the first circuit module and the second circuit module;
a first pressing portion which has an end fixed on the fixing portion, and which has the other end fixed on the substrate at a position different from the fixing portion to urge the first heat conducting member toward the first element portion; and
a second pressing portion which has an end fixed on the fixing portion, and which has the other end fixed on the substrate at a position different from the fixing portion to urge the second heat conducting member toward the second element portion.

6. The electronic apparatus according to claim 5, wherein lines linking the other end of the first pressing portion with the fixing portion and linking the other end of the second pressing portion with the fixing portion are parallel to a line linking the first element portion with the second element portion.

7. The electronic apparatus according to claim 5, wherein the first pressing portion and the second pressing portion are provided integrally as one body.

8. The electronic apparatus according to claim 6, wherein the first pressing portion and the second pressing portion are provided integrally as one body.

9. An electronic apparatus comprising:
a housing;
a substrate built in the housing;
a first circuit module which is mounted on the substrate and has a first element portion;
a second circuit module which is mounted side by side with the first circuit module on the substrate and has a second element portion;
a first heat conducting member which is thermally connected to the first element portion;
a second heat conducting member which is thermally connected to the second element portion;
a first pressing portion which has a proximal portion supported between the first circuit module and the second circuit module, and which has a distal portion urge the first heat conducting member toward the first element portion; and a second pressing portion which has a proximal portion supported between the first circuit module and the second circuit module, and which has a distal portion urge the second heat conducting member toward the second element portion.

10. The electronic apparatus according to claim 9, wherein the first pressing portion and the second pressing portion are provided integrally as one body.

* * * * *